(12) United States Patent
Lai et al.

(10) Patent No.: US 7,737,488 B2
(45) Date of Patent: Jun. 15, 2010

(54) BLOCKING DIELECTRIC ENGINEERED CHARGE TRAPPING MEMORY CELL WITH HIGH SPEED ERASE

(75) Inventors: Sheng Chih Lai, Hsinchu (TW); Hang-Ting Lue, Hsinchu (TW); Chien Wei Liao, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 189 days.

(21) Appl. No.: 11/845,321

(22) Filed: Aug. 27, 2007

(65) Prior Publication Data

US 2009/0039416 A1 Feb. 12, 2009

Related U.S. Application Data

(60) Provisional application No. 60/954,820, filed on Aug. 9, 2007.

(51) Int. Cl.
*H01L 29/792* (2006.01)
*H01L 21/336* (2006.01)

(52) U.S. Cl. ............... 257/325; 257/324; 257/E21.423; 257/E29.309; 438/287

(58) Field of Classification Search .......... 257/324, 257/325, E21.423, E29.309; 438/287
See application file for complete search history.

(56) References Cited

U.S. PATENT DOCUMENTS

| | | | |
|---|---|---|---|
| 4,630,086 A | 12/1986 | Sato et al. | |
| 4,959,812 A | 9/1990 | Momodomi et al. | |
| 5,270,969 A | 12/1993 | Iwahashi et al. | |
| 5,278,439 A | 1/1994 | Ma et al. | |
| 5,286,994 A | 2/1994 | Ozawa et al. | |
| 5,319,229 A | 6/1994 | Shimoji et al. | |
| 5,355,464 A | 10/1994 | Fandrich et al. | |
| 5,408,115 A | 4/1995 | Chang | |
| 5,412,603 A | 5/1995 | Schreck et al. | |
| 5,424,569 A | 6/1995 | Prall | |
| 5,448,517 A | 9/1995 | Iwahashi et al. | |
| 5,483,486 A | 1/1996 | Javanifard et al. | |
| 5,485,422 A | 1/1996 | Bauer et al. | |
| 5,509,134 A | 4/1996 | Fandrich et al. | |

(Continued)

FOREIGN PATENT DOCUMENTS

| | | |
|---|---|---|
| EP | 1411555 | 4/2004 |
| EP | 1689002 | 8/2006 |
| JP | 11040682 | 2/1999 |
| JP | 2004363329 | 12/2004 |
| WO | WO-9428551 | 12/1994 |
| WO | WO-0137347 | 5/2001 |

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner*—Jerome Jackson, Jr.
*Assistant Examiner*—Yu Chen
(74) *Attorney, Agent, or Firm*—Haynes Beffel & Wolfeld LLP (57) ABSTRACT

A band gap engineered, charge trapping memory cell includes a charge trapping element that is separated from a gate by a blocking layer of metal doped silicon oxide material having a medium dielectric constant, such as aluminum doped silicon oxide, and separated from the semiconductor body including the channel by an engineered tunneling dielectric.

24 Claims, 9 Drawing Sheets

U.S. PATENT DOCUMENTS

| | | |
|---|---|---|
| 5,515,324 A | 5/1996 | Tanaka et al. |
| 5,602,775 A | 2/1997 | Vo |
| 5,644,533 A | 7/1997 | Lancaster et al. |
| 5,668,029 A | 9/1997 | Huang et al. |
| 5,694,356 A | 12/1997 | Wong et al. |
| 5,745,410 A | 4/1998 | Yiu et al. |
| 5,753,950 A | 5/1998 | Kojima et al. |
| 5,768,192 A | 6/1998 | Eitan et al. |
| RE35,838 E | 7/1998 | Momodomi et al. |
| 5,835,396 A | 11/1998 | Zhang |
| 5,877,054 A | 3/1999 | Yamauchi et al. |
| 5,883,409 A | 3/1999 | Guterman et al. |
| 5,895,949 A | 4/1999 | Endoh et al. |
| 5,952,692 A | 9/1999 | Nakazato et al. |
| 5,966,603 A | 10/1999 | Eitan et al. |
| 6,011,725 A | 1/2000 | Eitan et al. |
| 6,026,026 A | 2/2000 | Chan et al. |
| 6,034,896 A | 3/2000 | Ranaweera et al. |
| 6,074,917 A | 6/2000 | Chang et al. |
| 6,096,603 A | 8/2000 | Chang et al. |
| 6,151,248 A | 11/2000 | Harari et al. |
| 6,169,693 B1 | 1/2001 | Chan et al. |
| 6,172,907 B1 | 1/2001 | Jenne |
| 6,194,272 B1 | 2/2001 | Sung et al. |
| 6,215,148 B1 | 4/2001 | Eitan et al. |
| 6,218,700 B1 | 4/2001 | Papadas et al. |
| 6,219,276 B1 | 4/2001 | Parker |
| 6,297,096 B1 | 10/2001 | Boaz et al. |
| 6,320,786 B1 | 11/2001 | Chang et al. |
| 6,322,903 B1 | 11/2001 | Siniaguine et al. |
| 6,356,478 B1 | 3/2002 | McCollum |
| 6,363,013 B1 | 3/2002 | Lu et al. |
| 6,396,741 B1 | 5/2002 | Bloom et al. |
| 6,436,768 B1 | 8/2002 | Yang et al. |
| 6,458,642 B1 | 10/2002 | Yeh et al. |
| 6,487,114 B2 | 11/2002 | Jong et al. |
| 6,512,696 B1 | 1/2003 | Fan et al. |
| 6,522,585 B2 | 2/2003 | Pasternak |
| 6,538,923 B1 | 3/2003 | Parker |
| 6,552,386 B1 | 4/2003 | Wu et al. |
| 6,566,699 B2 | 5/2003 | Eitan et al. |
| 6,587,903 B2 | 7/2003 | Roohparvar |
| 6,614,070 B1 | 9/2003 | Hirose et al. |
| 6,614,694 B1 | 9/2003 | Yeh et al. |
| 6,617,639 B1 | 9/2003 | Wang et al. |
| 6,643,181 B2 | 11/2003 | Sofer et al. |
| 6,643,185 B1 | 11/2003 | Wang et al. |
| 6,645,813 B1 | 11/2003 | Hsieh et al. |
| 6,646,924 B1 | 11/2003 | Tsai et al. |
| 6,653,733 B1 | 11/2003 | Gonzalez et al. |
| 6,657,252 B2 | 12/2003 | Fried et al. |
| 6,657,894 B2 | 12/2003 | Yeh et al. |
| 6,670,240 B2 | 12/2003 | Ogura et al. |
| 6,670,671 B2 | 12/2003 | Sasago et al. |
| 6,674,138 B1 | 1/2004 | Halliyal et al. |
| 6,677,200 B2 | 1/2004 | Lee et al. |
| 6,690,601 B2 | 2/2004 | Yeh et al. |
| 6,709,928 B1 | 3/2004 | Jenne et al. |
| 6,714,457 B1 | 3/2004 | Hsu et al. |
| 6,720,630 B2 | 4/2004 | Mandelman et al. |
| 6,744,105 B1 | 6/2004 | Chen et al. |
| 6,784,480 B2 | 8/2004 | Bhattacharyya |
| 6,795,357 B1 | 9/2004 | Liu et al. |
| 6,798,012 B1 | 9/2004 | Ma et al. |
| 6,815,805 B2 | 11/2004 | Weimer |
| 6,818,558 B1 | 11/2004 | Rathor et al. |
| 6,829,175 B2 | 12/2004 | Tsai et al. |
| 6,841,813 B2 | 1/2005 | Walker et al. |
| 6,856,551 B2 | 2/2005 | Mokhlesi et al. |
| 6,858,899 B2 | 2/2005 | Mahajani et al. |
| 6,858,906 B2 | 2/2005 | Lee et al. |
| 6,885,044 B2 | 4/2005 | Ding |
| 6,888,750 B2 | 5/2005 | Walker et al. |
| 6,897,533 B1 | 5/2005 | Yang et al. |
| 6,912,163 B2 | 6/2005 | Zheng et al. |
| 6,925,007 B2 | 8/2005 | Harari et al. |
| 6,933,555 B2 | 8/2005 | Hsieh et al. |
| 6,937,511 B2 | 8/2005 | Hsu et al. |
| 6,970,383 B1 | 11/2005 | Han et al. |
| 6,977,201 B2 | 12/2005 | Jung et al. |
| 6,995,424 B2 | 2/2006 | Lee et al. |
| 6,996,011 B2 | 2/2006 | Yeh et al. |
| 7,005,366 B2 | 2/2006 | Chau et al. |
| 7,012,297 B2 | 3/2006 | Bhattacharyya |
| 7,018,895 B2 | 3/2006 | Ding |
| 7,026,682 B2 | 4/2006 | Chung et al. |
| 7,057,234 B2 | 6/2006 | Tiwari |
| 7,071,061 B1 | 7/2006 | Pittikoun et al. |
| 7,075,828 B2 | 7/2006 | Lue et al. |
| 7,106,625 B2 | 9/2006 | Yeh et al. |
| 7,115,469 B1 | 10/2006 | Halliyal et al. |
| 7,115,942 B2 | 10/2006 | Wang |
| 7,120,059 B2 | 10/2006 | Yeh et al. |
| 7,129,538 B2 | 10/2006 | Lee et al. |
| 7,133,313 B2 | 11/2006 | Shih et al. |
| 7,135,734 B2 | 11/2006 | Eldridge et al. |
| 7,151,692 B2 | 12/2006 | Wu et al. |
| 7,154,143 B2 | 12/2006 | Jung et al. |
| 7,154,779 B2 | 12/2006 | Mokhlesi et al. |
| 7,157,769 B2 | 1/2007 | Forbes |
| 7,158,420 B2 | 1/2007 | Lung |
| 7,164,603 B2 | 1/2007 | Shih et al. |
| 7,166,513 B2 | 1/2007 | Hsu et al. |
| 7,187,590 B2 | 3/2007 | Zous et al. |
| 7,190,614 B2 | 3/2007 | Wu et al. |
| 7,209,386 B2 | 4/2007 | Yeh et al. |
| 7,209,390 B2 | 4/2007 | Lue et al. |
| 7,250,646 B2 | 7/2007 | Walker et al. |
| 7,279,740 B2 | 10/2007 | Bhattacharyya et al. |
| 2001/0012663 A1 | 8/2001 | Magri' et al. |
| 2001/0055838 A1 | 12/2001 | Walker et al. |
| 2002/0167844 A1 | 11/2002 | Han et al. |
| 2002/0179958 A1 | 12/2002 | Kim |
| 2003/0025147 A1 | 2/2003 | Nomoto et al. |
| 2003/0030100 A1 | 2/2003 | Lee et al. |
| 2003/0032242 A1 | 2/2003 | Lee et al. |
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2004/0079983 A1 | 4/2004 | Chae et al. |
| 2004/0084714 A1 | 5/2004 | Ishii et al. |
| 2004/0125629 A1 | 7/2004 | Scheuerlein et al. |
| 2004/0145024 A1 | 7/2004 | Chen et al. |
| 2004/0183126 A1 | 9/2004 | Bae et al. |
| 2004/0251489 A1* | 12/2004 | Jeon et al. .................. 257/315 |
| 2004/0256679 A1 | 12/2004 | Hu |
| 2005/0001258 A1 | 1/2005 | Forbes |
| 2005/0006696 A1 | 1/2005 | Noguchi et al. |
| 2005/0023603 A1 | 2/2005 | Eldridge et al. |
| 2005/0062091 A1 | 3/2005 | Ding |
| 2005/0074937 A1 | 4/2005 | Jung |
| 2005/0093054 A1 | 5/2005 | Jung |
| 2005/0218522 A1 | 10/2005 | Nomoto et al. |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0255652 A1 | 11/2005 | Nomoto et al. |

| | | | |
|---|---|---|---|
| 2005/0270849 A1 | 12/2005 | Lue | |
| 2005/0281085 A1 | 12/2005 | Wu | |
| 2006/0007732 A1 | 1/2006 | Yeh | |
| 2006/0044872 A1 | 3/2006 | Nazarian | |
| 2006/0118858 A1* | 6/2006 | Jeon et al. | 257/321 |
| 2006/0197145 A1 | 9/2006 | Pittikoun et al. | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202256 A1 | 9/2006 | Harari | |
| 2006/0202261 A1 | 9/2006 | Lue et al. | |
| 2006/0234446 A1 | 10/2006 | Wei et al. | |
| 2006/0258090 A1 | 11/2006 | Bhattacharyya et al. | |
| 2006/0261401 A1 | 11/2006 | Bhattacharyya | |
| 2006/0275986 A1 | 12/2006 | Kobayashi et al. | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0032018 A1 | 2/2007 | Tuntasood et al. | |
| 2007/0045718 A1 | 3/2007 | Bhattacharyya | |
| 2007/0069283 A1 | 3/2007 | Shih et al. | |
| 2007/0076477 A1 | 4/2007 | Hwang et al. | |
| 2007/0120179 A1* | 5/2007 | Park et al. | 257/324 |
| 2007/0138539 A1 | 6/2007 | Wu et al. | |
| 2009/0039417 A1* | 2/2009 | Chen et al. | 257/326 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4 (2003).

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Chang, Kuo-Tung, et al., "A New SONOS Memory Using Source-Side Injection for Programming," IEEE Electron Device Letters, vol. 19, No. 7, Jul. 1998, 253-255.

Chindalore et al., "A New Combination-Erase Technique for Erasing Nitride Based (SONOS) Nonvolatile Memories," IEEE Electron Dev Lett 24(4) Apr. 2003, 257-259.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan et al., "NROM: A Novel Localized Trapping, 2-Bit Nonvolatile Memory Cell," IEEE Electron Device Lett 21(11) Nov. 2000, 543-545.

Fujiwara, I., et al., "0.13 µm MONOS single transistor memory cell with deparated source lines," IEDM 1998, 995-998.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Govoreanu et al., "Simulation of Nanofloating Gate Memory with High-k Stacked Dielectrics," IEEE SISPAD Int'l Conf. 305 Sep. 2003, 299-302.

Govoreanu et al., "Variot: A Novel Multilayer Tunnel Barrier Concept for Low-Voltage Nonvolatile Memory Devices," IEEE Electron Dev. Lett. 24(2) Feb. 2003 94-10.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Kim et al., "Robust Multi-bit Programmable Flash Memory Using a Resonant Tunnel Barrier," Electron Dev. Mtg. Dec. 5-7, 2005, IEDM Tech Dig. 861-864.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Kobayashi, T., et al., "A Giga-Scale Assist-Gate (AG)-And-Type Flash Memory Cell with 20-MB/s Programming Throughput for Content-Downloading Applications," IEDM 2001, 2.2.1-2.2.4.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lee, Chang, et al., "A Novel SONOS Structure of SiO2/SiN/Al2O3 with TaN Metal Gate for Multi-Giga Bit Flash Memeries," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22. 6..4 (2003).

Lee, Jae-Duk, et al., "Effects of Floating-Gate Interference on NAND Flash Memory Cell Operation," IEEE Electron Device Letters, vol. 23, No. 5, May 2002, 264-266.

Likharev, "Layered Tunnel Barriers for Nonvolatile Memory Devices," Appl. Phys. Lett. 73(15) Oct. 1998 2137-2139.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "A Novel P-Channel NAND-Type Flash memory with 2-bit/cell Operation and High Programming Throughput (>20 MB/sec)," IEEE 2005, 4 pages.

Lue et al., "BE-SONOS: A Bandgap Engineered SONOS with Excellent Performance and Reliability," IEDM Tech Digest, IEEE Int'l Dec. 2005, 547-550.

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Minami et al., "New Scaling Guidelines for MNOS Nonvolatile Memory Devices," IEEE Trans on Electron Devices 38(11) Nov. 1991 2519-2526.

Furnemont et al. "Physical Understanding of SANOS Disturbs and VARIOT Engineered Barrier as a Solution," IEEE 2007, 94-95.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Sasago, Y. et al., "90-nm-node multi-level AG-AND type flash memory with cell size of true 2 F/sup 2//bit and programming throughput of 10 MB/s," IEDM, 2003, pp. 823-826.

Shih et al., "A Novel 2-bit/cell Nitride Storage Flash memory with Greater than 1M P/E-cycle Endurance," IEEE IEDM 2004, pp. 36.3. 1-36.3.4.

Shin, Yoocheol, et al., "High Reliable SONOS-type NAND Flash Memory Cell with Al2O3 for Top Oxide," Non-Volatile Semiconductor Memory Workshop, 2003, 2 pages.

Sung, et al., "Multi-layer SONOS with Direct Tunnel Oxide for High Speed and Long Retention Time," IEEE 2002 Nanoelectronics Workshop, Jun. 2002, 83-84.

Takata, M., et al., "New Non-Volatile Memory with Extremely High Density Metal Nano-Dots," IEEE IEDM 03-553, 22.5.1-22.5.4.

Tsai, Ping-Hung, et al., "Novel SONOS-Type Nonvolatile Memory Device with Suitable Band Offset in HfAlO Charge-Trapping Layer," Int'l Symp on VLSI Technology, Systems and Applications, Apr. 23-25, 2007, pp. 1-2.

Walker, et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

White et al., "On the Go with SONOS" IEEE Circuits and Devices, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada, et al., "A self-convergence erasing scheme for a simple stacked gate flash EEPROM," Proc. of the Int'l Electron Dev. Mtg., IEEE Dec. 1991, 307-310.

Yeh, C.C., et al., "PHINES: A Novel Low Power Program/Erase, Small Pitch, 2-Bit per Cell Flash Memory," IEDM Tech. Dig. 2002, 931-934.

Shin, Yoocheol, et al., "A Novel NAND-type MONOS Memory using 63nm Process Technology for Multi-Gigabit Flash EEPROMs," IEEE 2005, 4 pages.

Park, Youngwoo, et al., "Highly Manufacturable 32Gb Multi-Level NAND Flash Memith 0.0098 $\mu m^2$ Cell Size Using TANOS (Si-Oxide-$Al_2O_3$—TaN) Cell Technology," Electron Devices Meeting, 2006.IEDM '06. International, Dec. 11-13, 2006 pp:1-4.

* cited by examiner

BLOCKING DIELECTRIC ENGINEERED CHARGE TRAPPING MEMORY CELL WITH HIGH SPEED ERASE

CROSS REFERENCE TO RELATED APPLICATION

The benefit of U.S. Provisional Patent Application No. 60/954,820, filed on 9 Aug. 2007, is hereby claimed.

BACKGROUND OF THE INVENTION

1. Field of the Invention

The present invention relates to flash memory technology, and more particularly to scalable charge trapping memory technology adaptable for high speed erase and program operations.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical charge trapping memory cell consists of a field effect transistor FET structure having a source and drain separated by a channel, and a gate separated from the channel by a stack of dielectric material including a tunnel dielectric layer, the charge storage layer, and a blocking dielectric layer. According to the early conventional designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed a silicon oxide (O), and the gate comprises polysilicon (S). The SONOS device is programmed by electron tunneling using one of a number of well-known biasing technologies, and erased by hole tunneling or electron de-trapping. In order to achieve practical operational speeds for the erase operation, the tunneling dielectric layer must be quite thin (less than 30 Å). However at that thickness, the endurance and charge retention characteristics of the memory cell are poor relative to traditional floating gate technology. Also, with relatively thick tunneling dielectric layers, the electric field required for the erase operation also cause electron injection from the gate through the blocking dielectric layer. This electron injection causes an erase saturation condition in which the charge level in the charge trapping device converges on an equilibrium level. See, U.S. Pat. No. 7,075,828, entitled "Operation Scheme with Charge Balancing Erase for Charge Trapping Non-Volatile Memory", invented by Lue et al. However, if the erase saturation level is too high, the cell cannot be erased at all, or the threshold margin between the programmed and erased states becomes too small for many applications.

On one hand, technology has been investigated to improve the ability of the blocking dielectric layer to reduce electron injection from the gate for the high electric fields needed for erase. See, U.S. Pat. No. 6,912,163, entitled "Memory Device Having High Work Function Gate and Method of Erasing Same," Invented by Zheng et al., issued 28 Jun. 2005; and U.S. Pat. No. 7,164,603, entitled "Operation Scheme with High Work Function Gate and Charge Balancing for Charge Trapping Non-Volatile Memory", invented by Shih et al., Shin et al., "A Highly Reliable SONOS-type NAND Flash Memory Cell with $Al_2O_3$ or Top Oxide," IEDM, 2003 (MANOS); and Shin et al., "A Novel NAND-type MONOS Memory using 63 nm Process Technology for a Multi-Gigabit Flash EEPROMs", IEEE 2005. In the just-cited references, the second Shin et al. article describes a SONOS type memory cell in which the gate is implemented using tantalum nitride and the blocking dielectric layer is implemented using aluminum oxide (referred to as the TANOS device), which maintains a relatively thick tunneling dielectric layer at about 4 nm. The relatively high work function of tantalum nitride inhibits electron injection through the gate, and the high dielectric constant of aluminum oxide reduces the magnitude of the electric field through the blocking dielectric layer relative to the electric field for the tunneling dielectric layer. Shin et al. report a trade-off between the breakdown voltage of the memory cell, the thickness of the aluminum oxide layer and the thickness of the tunneling dielectric layer. With a 4 nm thick silicon dioxide tunneling dielectric in a TANOS device, relatively high erase voltages are proposed in order to achieve erase speeds. An increase in erase speeds would require increasing the voltages applied or decreasing the thickness of the tunneling dielectric layer. Increasing the voltage applied for erase is limited by the breakdown voltage. Decreasing the thickness of the tunneling dielectric layer is limited by issues of charge retention, as mentioned above.

On the other hand, technology has been investigated to improve the performance of the tunneling dielectric layer for erase at lower electric fields. See, U.S. Patent Application Publication No. US 2006/0198189 A1, "Non-Volatile Memory Cells, Memory Arrays Including the Same and Method of Operating Cells and Arrays," Invented by Lue et al., publication date Sep. 7, 2006 (describing a "BE-SONOS device"); Lue et al., "BE-SONOS: A Bandgap Engineered SONOS with Excellent Performance and Reliability", IEEE, December 2005; Wang et al., "Reliability and Processing Effects of the Bandgap Engineered SONOS (BE-SONOS) Flash Memory", IEEE, May 2007. See also, U.S. Patent Application Publication No. 2006/0261401 A1, entitled "Novel Low Power Non-Volatile Memory and Gate Stack", by Bhattacharyya, published 23 Nov. 2006.

BE-SONOS technology has been proven to provide excellent performance, overcoming many of the erase speed, endurance and charge retention issues of prior art SONOS type memory. However, the problem of the erase saturation continues to limit operational parameters of the device. Furthermore, as the device sizes shrink, it is expected that erase saturation problems will intensify.

These prior art technologies have emphasized the advantages of high-K dielectrics like aluminum oxide. The higher dielectric constant can improve/performance by enhancing the program and erase speed, improving the memory window in threshold voltage for the cells, and reducing the operating voltage during program and erase by reducing the effective oxide thickness EOT. However, it is difficult to manufacture high κ materials like aluminum oxide with high quality. Therefore, the use of high κ materials for the blocking dielectric comes with the trade-off of lower reliability and lower data retention.

Accordingly, is desirable to provide a new memory technology which is readily manufactured with high quality, and overcomes the reliability and data retention issues of prior art technologies, and that can be applied in very small memory devices.

SUMMARY OF THE INVENTION

A blocking dielectric engineered, charge trapping memory cell is described including a charge trapping element that is separated from one of a gate and a semiconductor body including a channel by a blocking dielectric comprising a metal doped silicon oxide, such as aluminum doped silicon oxide, and that is separated from the other of the semiconductor body including the channel and the gate by a tunneling dielectric. The blocking dielectric layer is engineered to have a dielectric constant κ greater than silicon dioxide, and preferably in a range of about 4.5 to 7, and is paired with a gate material providing a relatively high electron barrier height, such as greater than 2.5 eV. As discussed in detail below, the electron barrier height and dielectric constant are tuned by selecting concentration of metal in the metal doped silicon oxide and by selecting a suitable gate material, to enable fast programming and fast erase without erase saturation, with excellent reliability and retention characteristics. A process for manufacturing the memory cell is described, which includes forming the metal doped silicon oxide layer as the blocking dielectric.

The technology is combined in the memory described here with a bandgap engineered tunneling dielectric that includes a combination of materials having negligible charge trapping efficiency, and band offset characteristics. The bandgap engineered tunneling dielectric lowers the operating voltages required for the device, and enables the use of blocking dielectrics having a medium range, compared to the prior art without significant tradeoffs in performance, while providing improved reliability. The band offset characteristics include a relatively large hole tunneling barrier height in a thin region at the interface with the semiconductor body, and an increase in valence band energy level so that the hole tunneling barrier height at a first offset less than 2 nm for example from the channel surface, from the interface is relatively low. The band offset characteristics also include an increase in conduction band energy by providing a thin layer of relatively high electron tunneling barrier height at a second offset more than 2 nm from the channel surface, separating the material with a relatively lower hole tunneling barrier height from the charge trapping layer.

The valence band energy level at the first offset is such that an electric field sufficient to induce hole tunneling through the thin region between the interface with the semiconductor body and the offset, is also sufficient to raise the valence band energy level after the offset to a level that effectively eliminates the hole tunneling barrier in the engineered tunneling dielectric after the offset. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=30 Å), which results in an increase in the valence band energy level of about 2.6 eV at an offset 15 Å or less, from the interface with the semiconductor body. The O2 layer separates the N1 layer from the charge trapping layer, at a second offset (e.g. about 35 to 45 Å from the interface), by a region of lower valence band energy level (higher hole tunneling barrier) and higher conduction band energy level. The electric field sufficient to induce hole tunneling between the interface and the first offset also raises the valence band energy level after the second offset to a level that effectively eliminates the hole tunneling barrier, because the second offset is at a greater distance from the interface. Therefore, the O2 layer does not significantly interfere with the electric field assisted hole tunneling, while improving the ability of the engineered tunneling dielectric to block leakage during low fields.

The blocking dielectric structure in a representative memory device, consists of aluminum doped silicon oxide, with from 0.1 to 50 atomic percent aluminum, which has a dielectric constant (κ about 4.5 to 7). Therefore, the electric field intensity in the blocking dielectric structure is relatively low compared to that in the tunneling dielectric layer.

Embodiments of the memory cell described herein include gates comprising polysilicon, such as n+ polysilicon, or metal, such as aluminum. In alternatives, the gates comprise materials having work functions that are greater than the work functions of n+ polysilicon, including for example, p+ polysilicon, platinum, tantalum nitride, and other materials chosen for work function, conductivity and manufacturability.

The present technology combines techniques for reducing the electric field in the blocking dielectric layer relative to the tunneling dielectric layer, with techniques for reducing the magnitude of the electric field required for erase to achieve high speed erase operations without saturation, enabling a large memory window compared to prior devices. Also, charge retention and endurance characteristics of the memory cell are very good.

Circuitry is coupled to the array of memory cells to apply bias voltages to selected memory cells for read, program and erase operations.

Other aspects and advantages of the present invention can be seen on review of the drawings, the detailed description in the claims which follow.

DETAILED DESCRIPTION

A detailed description of embodiments of the present invention is provided with reference to the FIGS. 1-11.

Figure 1:
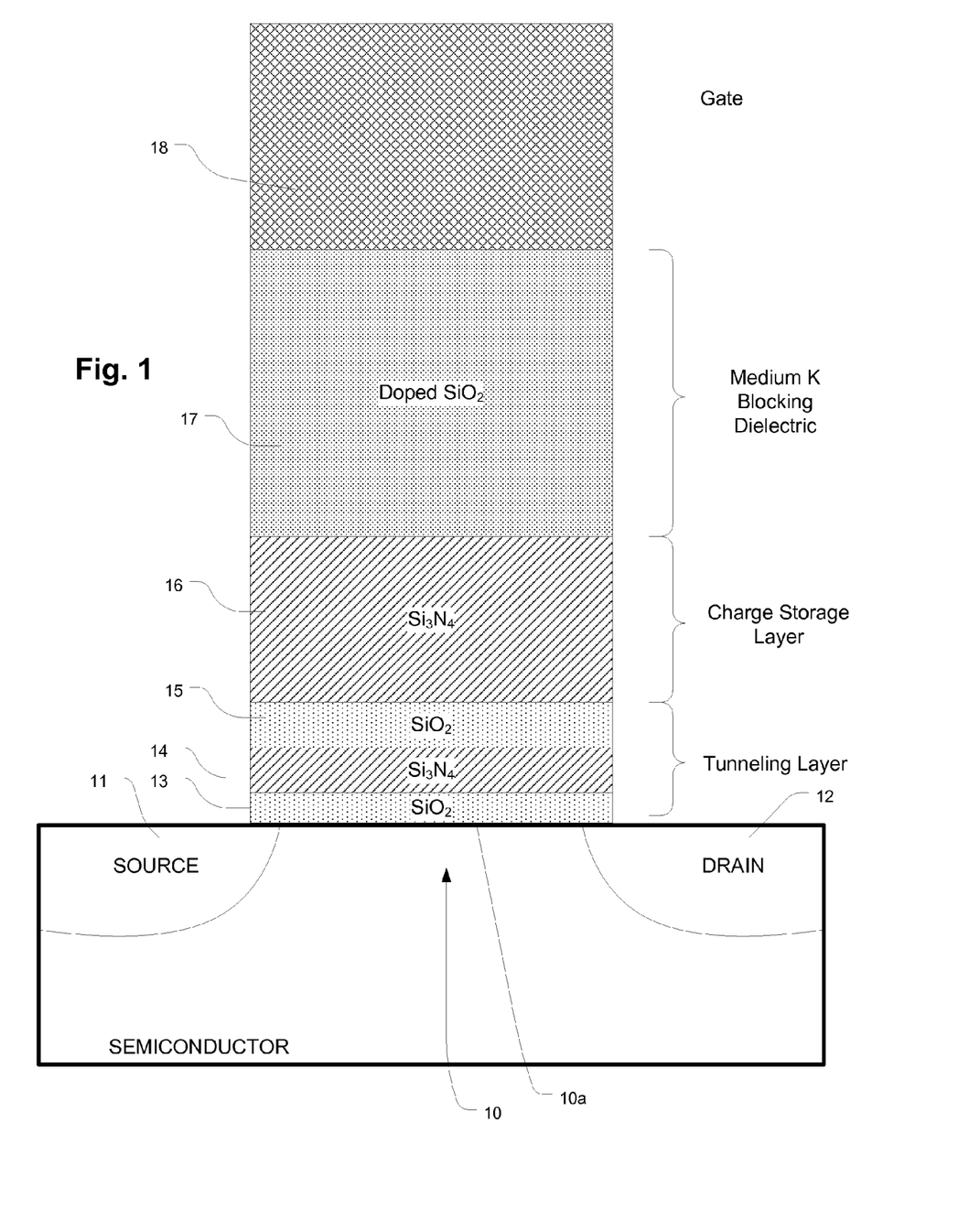
FIG. 1 is a simplified diagram of an embodiment of a memory cell according to the present invention.

FIG. 1 is a simplified diagram of a charge trapping memory cell employing a medium κ blocking dielectric layer and a band gap engineered dielectric tunneling layer. The memory cell includes a channel 10 in a semiconductor body, and a source 11 and a drain 12 adjacent channel.

A gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials. For some applications, it is preferable to use materials having work functions higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 1, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680 degrees C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 30 Å, and preferably 25 Å or less. The structure of the dielectric tunneling layer is described in more detail below with reference to FIGS. 2 and 3.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer 17 in this embodiment comprises aluminum doped silicon oxide, having a tuned dielectric constant κ between about 4.5 and 7. Al-doped silicon oxide can be formed by chemical vapor deposition CVD or atomic layer deposition ALD using precursors that provide aluminum, silicon and oxygen, such as Al—[O—C—$(CH_3)_3]_3$ for aluminum, dichlorosilane $SiH_2Cl_2$ or tetraethoxysilane TEOS for silicon and $N_2O$, $O_2$, or $O_3$ for oxygen. Using these processes, a layer of aluminum doped silicon oxide can be formed with very few defects, which provides a blocking dielectric layer that provides excellent retention characteristics. The dielectric constant is tuned by controlling the concentration of aluminum in the silicon oxide, as discussed below. The thickness of layer 17 of metal doped silicon oxide can be for example in the range of about 5 to 18 nanometers, while the thickness of the layer 16 of silicon nitride can be for example in the range of 5 to 7 nanometers. The layer 17 of aluminum doped silicon oxide in one example is about 9 nm. The thickness and quality of the blocking dielectric layer have a close relationship to cell reliability, especially for data retention. Although metal-doped silicon oxide can have a higher dielectric constant, the oxide quality (such as reflected by the number of crystal structure defects) becomes worse with increased doping levels. Therefore, the physical thickness of the layer must be increased (thicker than conventional $SiO_2$ sample) to maintain low leakage. However, it is not necessary to increase the thickness of metal-doped silicon dioxide by the full ratio of dielectric constants. Therefore, the EOT can be reduced and the operation voltage can be lowered.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17 can be 90 Å of aluminum doped silicon oxide, with about 10 atomic % aluminum (κ about 5.5, and band gap close to that silicon dioxide). The gate material can be p+ polysilicon (work function about 5.1 eV). This results in an electron barrier height between the gate and the blocking dielectric layer of about 3.9 eV.

In other embodiments described herein, "tuned" κ dielectric material such as hafnium-doped silicon oxide ($HfO_2$ having a κ of about 10), titanium-doped silicon ($TiO_2$ having a κ of about 60), praseodymium-doped silicon oxide ($Pr_2O_3$ having a κ of about 30), and zirconium (Zr)-doped silicon oxide, and lanthanum (La)-doped silicon oxide. Combinations of metals can be utilized, for example silicon oxide may be doped with combinations of Al and Hf, Al and Zr, Al and La or Al, Hf and La. Nitrogen doping may be combined with metal doping in some embodiments. The atomic percent concentration of the metal and other materials in the silicon oxide is tuned to achieve the desired dielectric constant, and can be as mentioned above in the range of 0.1 to 50 atomic percent. For Al-doped sample, there is almost no effect of doping concentration on the conduction and valence band energy levels because the bandgap of $Al_2O_3$ is almost the same as that of $SiO_2$.

For the Hf-doped samples, the conduction and valence energy levels become smaller when we increase the Hf doping concentration. However, the dielectric constant of Hf-doped silicon oxide can be higher than that of Al-doped silicon oxide in the same doping concentration level. So that the Hf-doped silicon oxide also can be used in this invention.

For most of metal-doped silicon oxide, except aluminum, the conduction band energy levels decreases and valence band energy level increases with the increase in metal doping concentration. However, the dielectric constants of these samples are almost much higher than that of Al-doped silicon oxide, which may compensate for the reduce electron barrier heights. Embodiments of the metal doped silicon oxide can include more than one metal doping material, and can include nitrogen doping in combination with metal doping, in order to tune the dielectric constant and band gap to suit the needs of a particular implementation.

The gate 18 comprises a material selected to provide sufficient electron barrier height for the blocking dielectric layer. Materials that may be used for the gate 18 include N+ poly silicon, Al, P+ poly silicon, Ti, TiN, Ta, TaN, Ru, Pt, Ir, $RuO_2$, $IrO_2$, W, WN, and others.

For 10% Al-doped silicon oxide, the dielectric constant is ~5.5 and the desired barrier height is ~3 eV to obtain the erase saturation $V_{FB}$<−2V. Since the barrier height of $Al_2O_3$ is almost the same as $SiO_2$, the electron barrier height of 10% Al-doped silicon oxide with N+ polysilicon gate is ~3.1 eV. This also indicates that the work function of gate materials must be higher than 4.2 eV because the work function of N+ poly silicon gate is ~4.3 eV. Therefore, the gate materials that can be used for 10% Al-doped silicon oxide are N+ poly silicon, P+ poly silicon, Ti, TiN, Ta, TaN, Ru, Pt, Ir, $RuO_2$, $IrO_2$, W, WN etc. P+ polysilicon is preferred in this example because of the ready manufacturability and process integration, and because the work function of P+ polysilicon is higher than that of N+ polysilicon. It is desirable to select a dielectric constant greater than 5 and an electron barrier height greater than 3.2 eV, according to the simulations described below.

Figure 2:
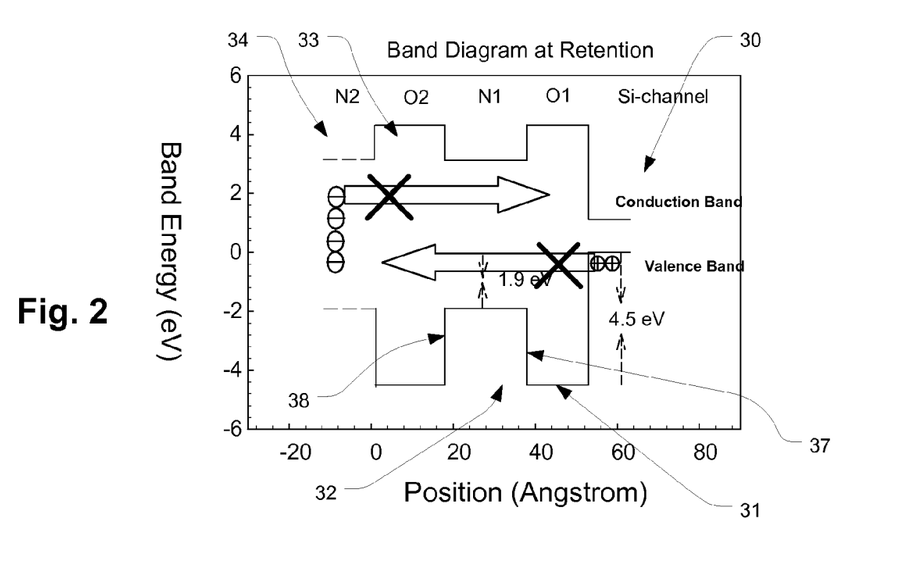
FIG. 2 is a band diagram for a tunneling dielectric layer including band offset technology at a low electric fields.

FIG. 2 is a diagram of the energy levels of the conduction and valence bands of the dielectric tunneling structure the including the stack of layers 13-15 of FIG. 1 under a low electric field, showing a "U-shaped" conduction band and an "inverted U-shaped" valence band. From the right side, the band gap for the semiconductor body is shown in region 30, the valence and conduction bands for the hole tunneling layer are shown in region 31, the band gap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer 34, and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three layers 31, 32, 33 the tunneling dielectric structure remain significantly below the valence band in the channel 30. The tunneling layer described herein therefore is characterized by band offset characteristics, include a relatively large hole tunneling barrier height in a thin region (layer 31) at the interface with the semiconductor body, and an increase 37 in valence band energy level at a first offset less than 2 nm from the channel surface. The band offset characteristics also include a decrease 38 in valence band energy level at a second offset from the channel by providing a thin layer 33 of relatively high tunneling barrier height material, resulting in the inverted U-shaped valence band shape. Likewise, the conduction band has a U-shape caused by the same selection of materials.

Figure 3:
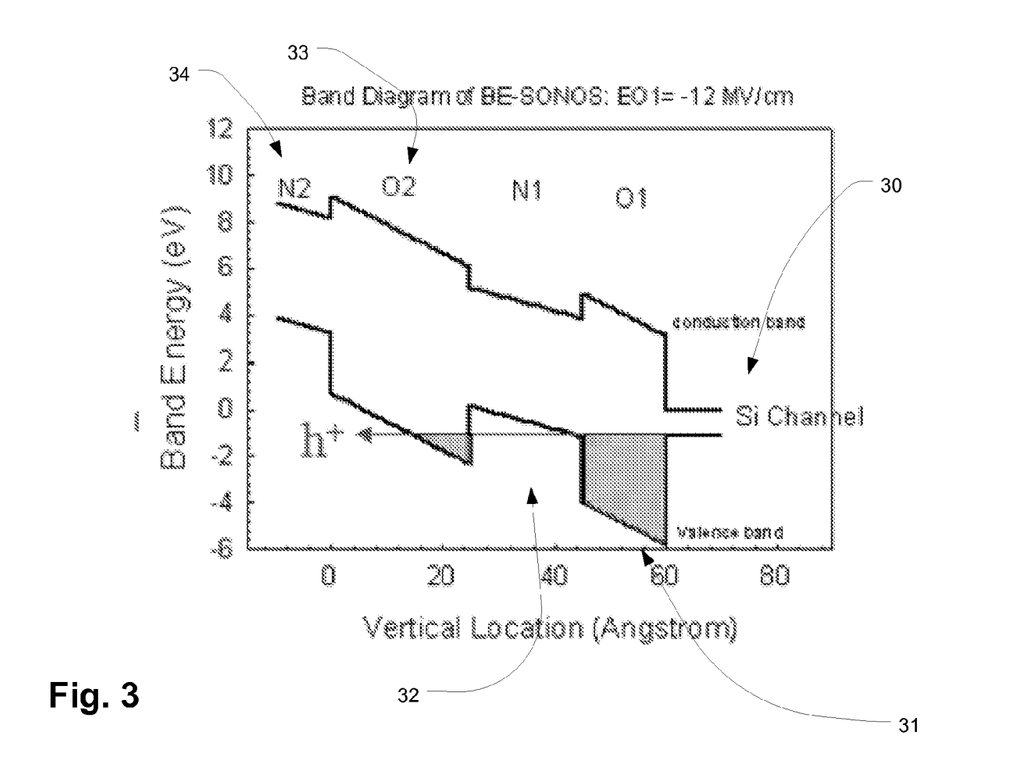
FIG. 3 is a band diagram for a tunneling dielectric layer including band offset technology at high electric fields.

FIG. 3 shows the band diagram for the dielectric tunneling structure under conditions of an electric field of about −12 MV/cm in the tunneling layer 31, for the purposes of inducing hole tunneling (in FIG. 3, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 3) between the level of the valence band in the channel and above sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer 33 isolates the offset layer 32 from a charge trapping layer 34. This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling layer 31, for an embodiment employing silicon dioxide, should be less than 20 Å thick, and more preferably less than 15 Å thick. For example, in a preferred embodiment, the hole tunneling layer 31 is silicon dioxide about 13 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using band gap engineering.

Figure 4:
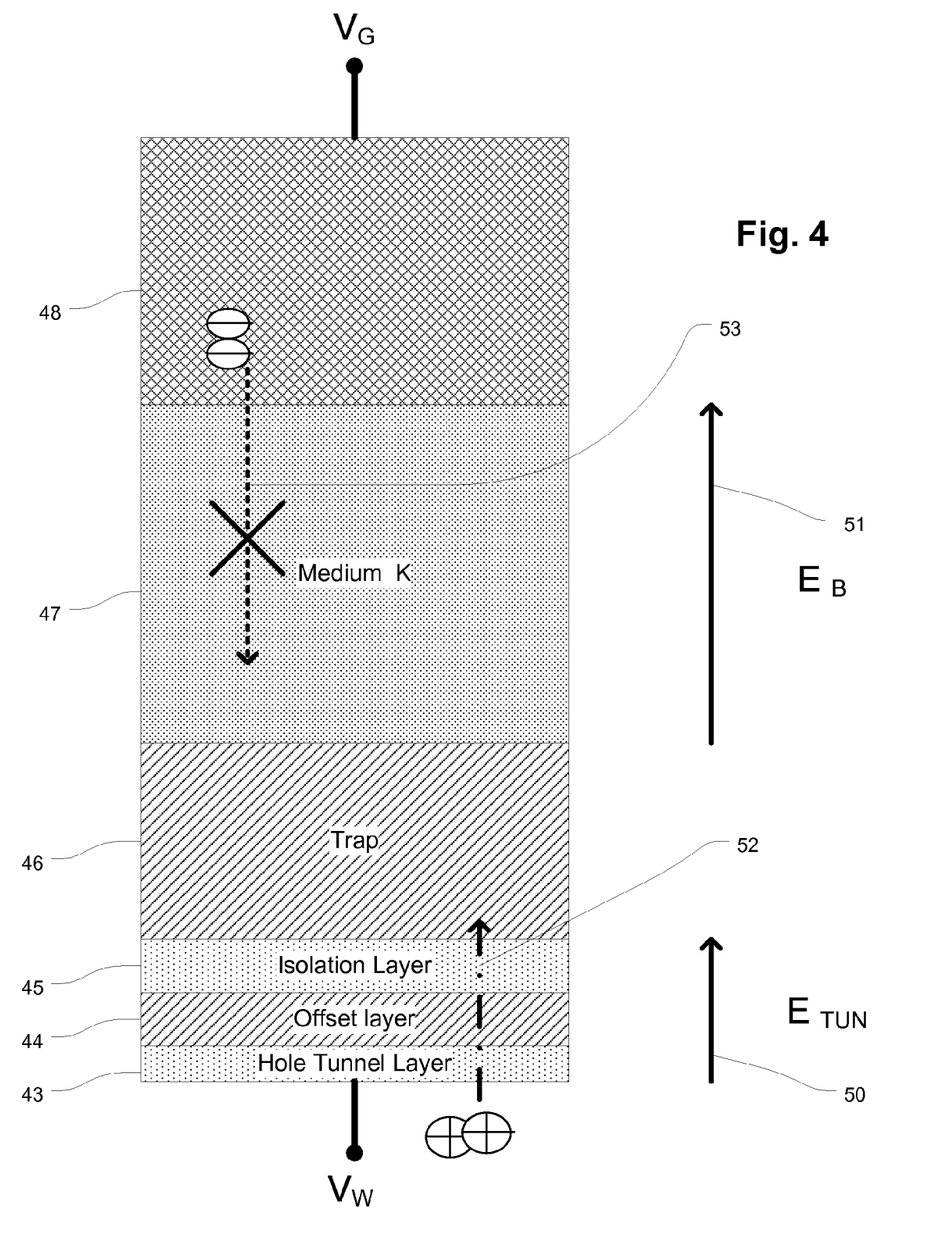
FIG. 4 illustrates the electric field intensities during an erase operation for an embodiment of a memory cell according to the present invention.

FIG. 4 is a schematic illustration of the gate stack for a charge trapping memory cell like that FIG. 1, showing electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer. A blocking dielectric layer 47 consisting of a medium κ insulator such as aluminum doped silicon oxide separates the charge trapping layer 46 from the metal gate 48. During an erase process, the electric field is induced by bias voltages $V_G$ and $V_W$ applied at the gate and channel of the memory cell, and results in an electric field $E_{TUN}$ 50 through the dielectric tunneling layer 43, 44, 45 and an electric field $E_B$ 51 through the blocking layer 47. The magnitude of the electric field $E_{TUN}$ 50 through the dielectric tunneling layer is sufficient to induce hole tunneling current 52 into the trapping layer 46. The magnitude of the electric field $E_B$ 51 through the blocking dielectric layer 47 is reduced relative to that through the silicon dioxide in the tunneling dielectric layer because of the higher dielectric constant by an amount that is about 3.9/K, where 3.9 is the dielectric constant for silicon dioxide. Therefore, because of sufficient electron affinity of the gate 48, the relatively lower electric field $E_B$ 51 and the thickness of the blocking dielectric layer 47, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

Figure 5:
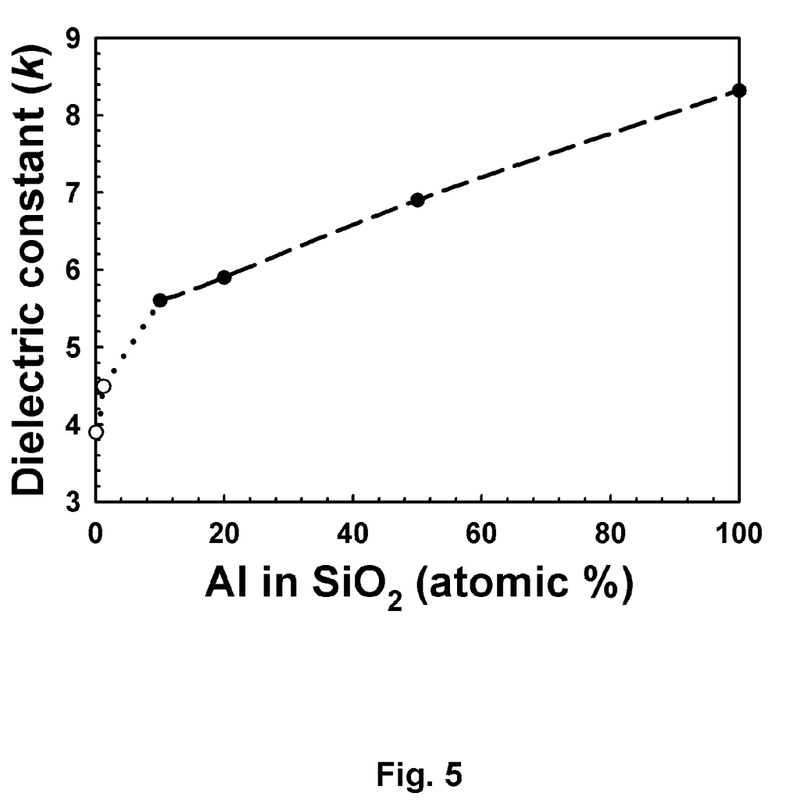
FIG. 5 is a graph of dielectric constant κ versus atomic percent aluminum doping in silicon oxide.

FIG. 5 shows the dielectric constant of Al-doped silicon oxide with various aluminum dopant concentrations, where the dielectric constant ranges from 4~8. The Al-doped silicon oxide is the preferred material for top dielectric because Al-doped silicon oxide has a large barrier height (the barrier height is does not fall significantly with the increase of Al dopant) and can be tuned to have a suitable dielectric constant. For very low atomic percent aluminum, the dielectric constant approaches that of pure silicon dioxide which is 3.9. Between about 0.1 atomic percent and about 50 atomic percent aluminum, the dielectric constant ranges from about 4 to about 7. Aluminum doped silicon dioxide has an electron tunneling barrier that is very close to that of pure silicon dioxide, and decreases only a small amount with increase in atomic percent of aluminum, at least in the range of up to 50 atomic percent. The preferred range is about 1 to 10 atomic % aluminum, where the dielectric constant is about 4.5 to 5.5, because the number of defects in the material will be very low, but the dielectric constant is high enough and the band gap is large enough, that it can be paired with a readily manufacturable gate material like p+ polysilicon. With a tunable dielectric constant, and a high electron barrier height, aluminum doped silicon dioxide is an excellent material for this use, enabling the formation of memory cells having low or negative erase saturation thresholds, fast program and erase, high retention and low EOT and low voltage operation. All of these attribute support scaling of the memory cell to very small gate length dimensions, including gate lengths of 50 nm and less.

Figure 6:
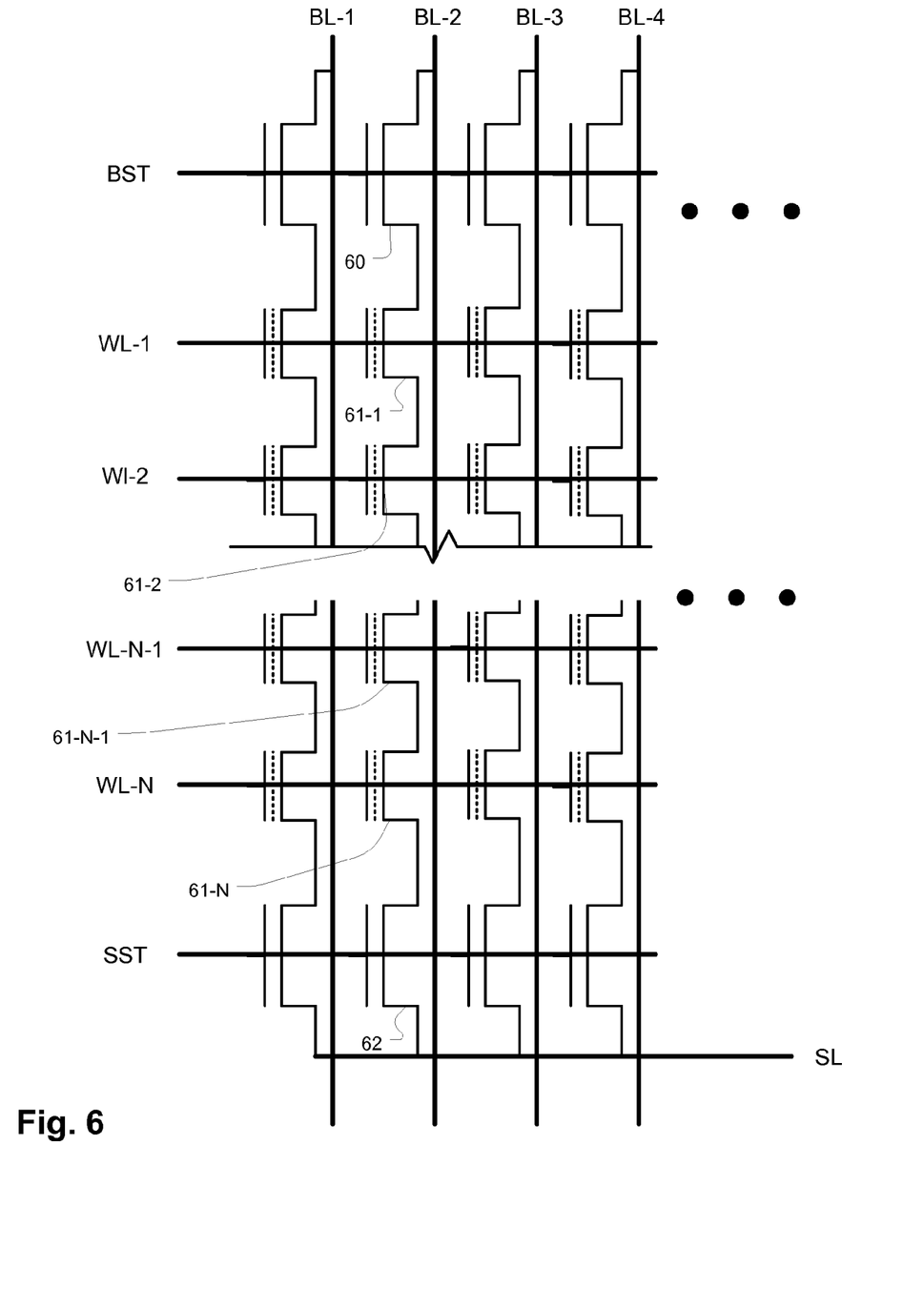
FIG. 6 is a schematic diagram of a NAND-type memory array employing memory cells according to the present invention.

Memory cells implemented as described above can be arranged in a NAND-type array as shown in FIG. 6. The array includes a plurality of bit lines BL-1, BL-2, BL-3, BL-4, . . . , and a plurality of word lines WL-1, WL-2, . . . , WL-N–1, WL-N. Groups of N memory cells are connected in series between a block select transistor coupled to a corresponding bit line and a source select transistor coupled to a source line. A block select word line BST is coupled to a row of block select transistors and a source select word line SST is coupled to a row of source line connect transistors. Thus, for example, for a representative bit line, BL-2, in the figure, a block select transistor 60 connects a series of memory cells 61-1 through 61-N to the bit line BL-2 in response to the signal BST on the block select word line. The last memory cell 61-N in the series is connected to source select transistor 62 which couples the series to the source line SL in response to the signal SST on a source select word line.

In the alternative, the memory cells can be arranged AND-type, NOR-type and virtual ground-type arrays often applied in flash memory devices.

Programming may be accomplished in the NAND array by applying incremental stepped pulse programming ISPP or other processes for inducing Fowler Nordheim tunneling. ISPP involves applying a stepped programming voltage, starting at a gate bias of for example about plus 17 V, and incrementing the voltage for each programming step by about 0.2 V. Each pulse can have a constant pulse width of about 10 μs for example. In variations of the technique, the pulse width and the increment applied for each succeeding pulse can be varied to meet the needs of the particular implementation. The memory cells of this type have demonstrated relatively linear programming characteristics, and very large memory windows compared to the prior art, making them particularly well-suited to storing multiple bits per cell with multilevel programming technologies. In alternative embodiments, the so-called voltage pulse self-boosting technique is applied for programming. Other biasing arrangements can be applied as well, selected for compatibility with array characteristics.

Other programming bias techniques can be applied. For NOR array structures, various biasing arrangements for inducing hot electron tunneling or FN tunneling may be applied as well as other techniques known in the art.

Figure 7:
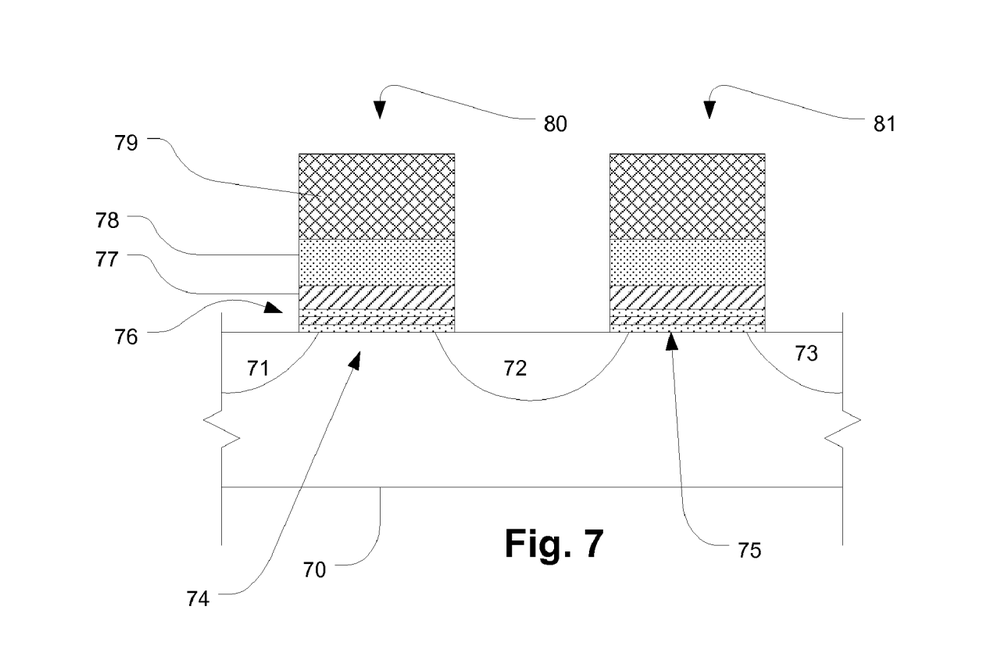
FIG. 7 is a simplified cross-sectional view of memory cells according to the present invention in a NAND configuration, taken perpendicular to word lines.
Figure 8:
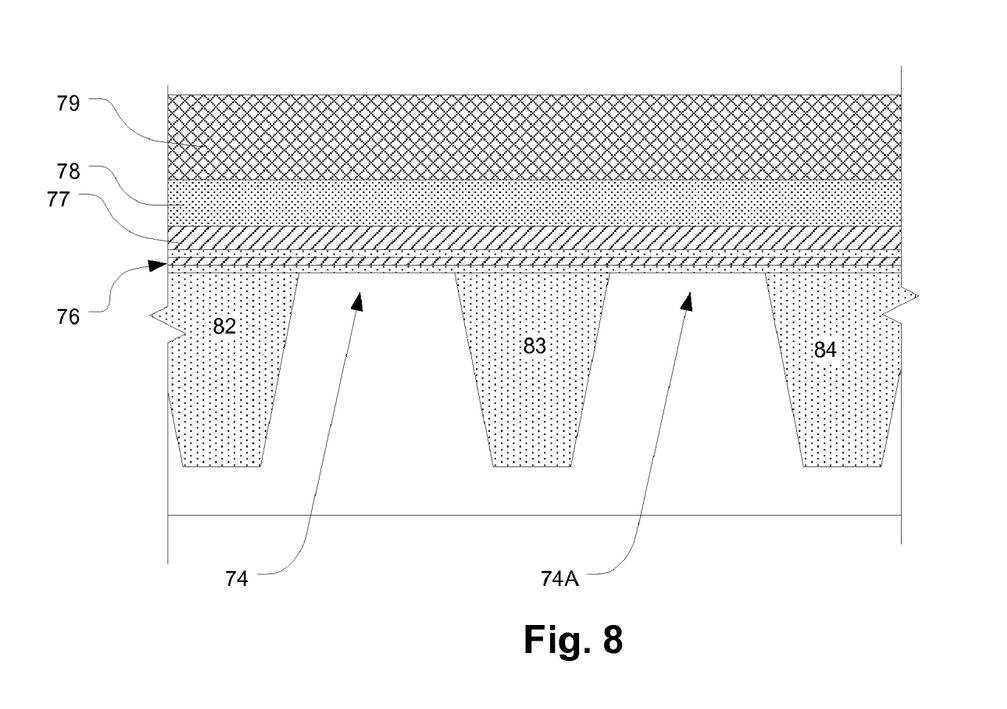
FIG. 8 is a simplified cross-sectional view of memory cells according to the present invention in a NAND configuration, taken through a word line.

FIGS. 7 and 8 show cross-sectional views of a representative memory cell structure as described herein implemented in a NAND-type array, taken across the word lines and along the word line respectively. FIG. 7 shows a semiconductor body 70 including channel regions 74, 75 and source/drain terminals 71, 72, 73 contacting the channel regions. The channel length between the source and drain terminals is preferably less than 50 nm, and in preferred embodiments 30 nm or less. The composite dielectric tunneling layer 76, the charge trapping layer 77, the blocking dielectric layer 78 and the metal gate word line layer 79 are arranged in stacks 80 and 81 over the channel regions 74 and 75 of respectively.

FIG. 8 shows the structure of FIG. 7 taken in cross section along a word line which includes the same stack with the same reference numerals as described with reference to FIG. 7. Column of series connected cells are separated by shallow trench isolation STI structures 82, 83, 84. In the illustration, the surfaces of the channel 74, and of the adjacent channel 74A, are planar. Implementations of the device may include recessed (concave) channel surfaces in this cross-section, or extended (convex) channel surfaces, depending on the manufacturing techniques and the desired product. The tunneling dielectric layer 76 and the rest of the stack 77, 78, 79 overlie the channel surfaces, whether planar, concave or convex, in a conformal manner. The channel width between the STI structures (e.g., 82, 83) is preferably less than 50 nm, and more preferably as small as the STI techniques allow.

Figure 9:
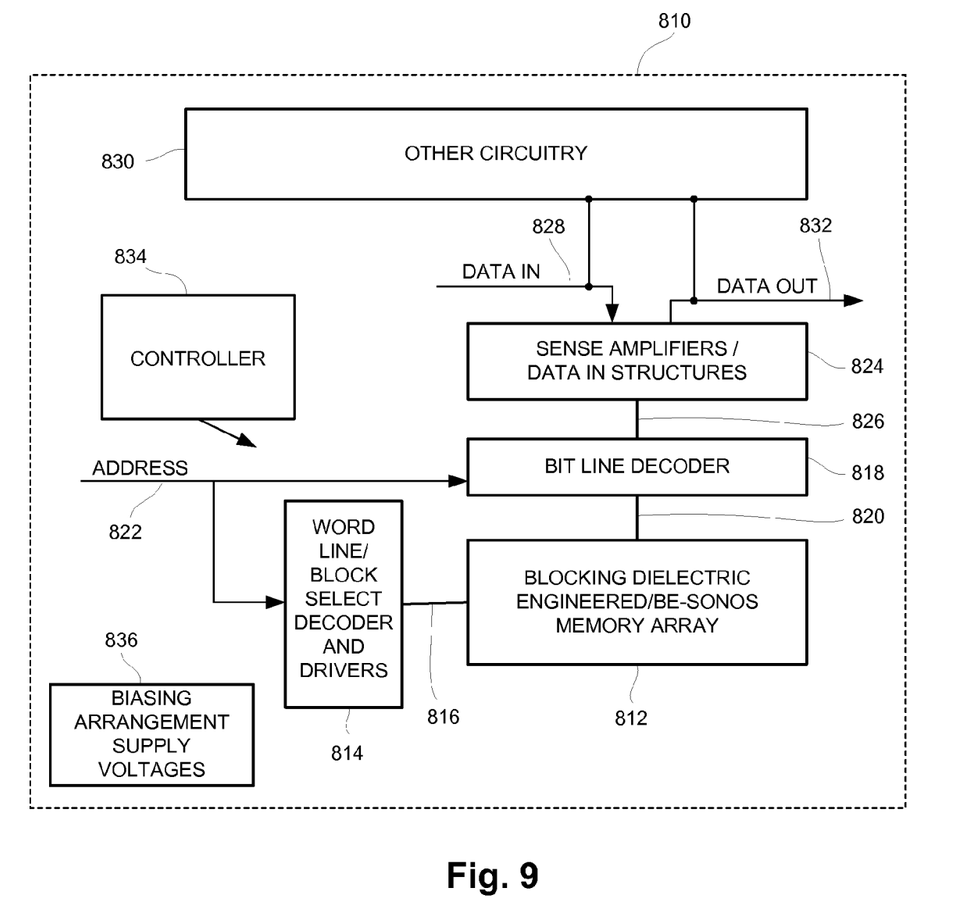
FIG. 9 is a block diagram of an integrated circuit memory employing memory cells and bias circuitry according to embodiments of the present invention.

FIG. 9 is a simplified block diagram of an integrated circuit employing blocking dielectric engineered BE-SONOS memory cells as described herein having a metal or polysilicon gate, a blocking layer of aluminum doped silicon oxide or other metal doped silicon oxide having dielectric constant κ tuned to the range of about 4.5 to 7, and a band gap engineered tunneling dielectric layer. The integrated circuit 810 includes a memory array 812 implemented using blocking dielectric engineered BE-SONOS memory cells as described herein on a semiconductor substrate. A word line (or row) and block select decoder 814 is coupled to, and in electrical communication with, a plurality 816 of word lines and block select lines, and arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Addresses are supplied on bus 822 to the word line decoder and drivers 814 and to the bit line decoder 818. Sense amplifiers and data-in structures in block 824, including current sources for the read, program and erase modes, are coupled to the bit line decoder 818 via data the bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

The array 812 can be a NAND array, an AND array or a NOR array, depending on the particular application. The very large memory window available supports storing multiple bits per cell, and thus multiple bit sense amplifiers can be included on the device.

A controller implemented in this example, using bias arrangement state machine 834, controls the application of bias arrangement supply voltages and current sources 836, such as read, program, erase, erase verify, program verify voltages or currents for the word lines and bit lines, and controls the word line/source line operation using an access control process. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

Figure 10:
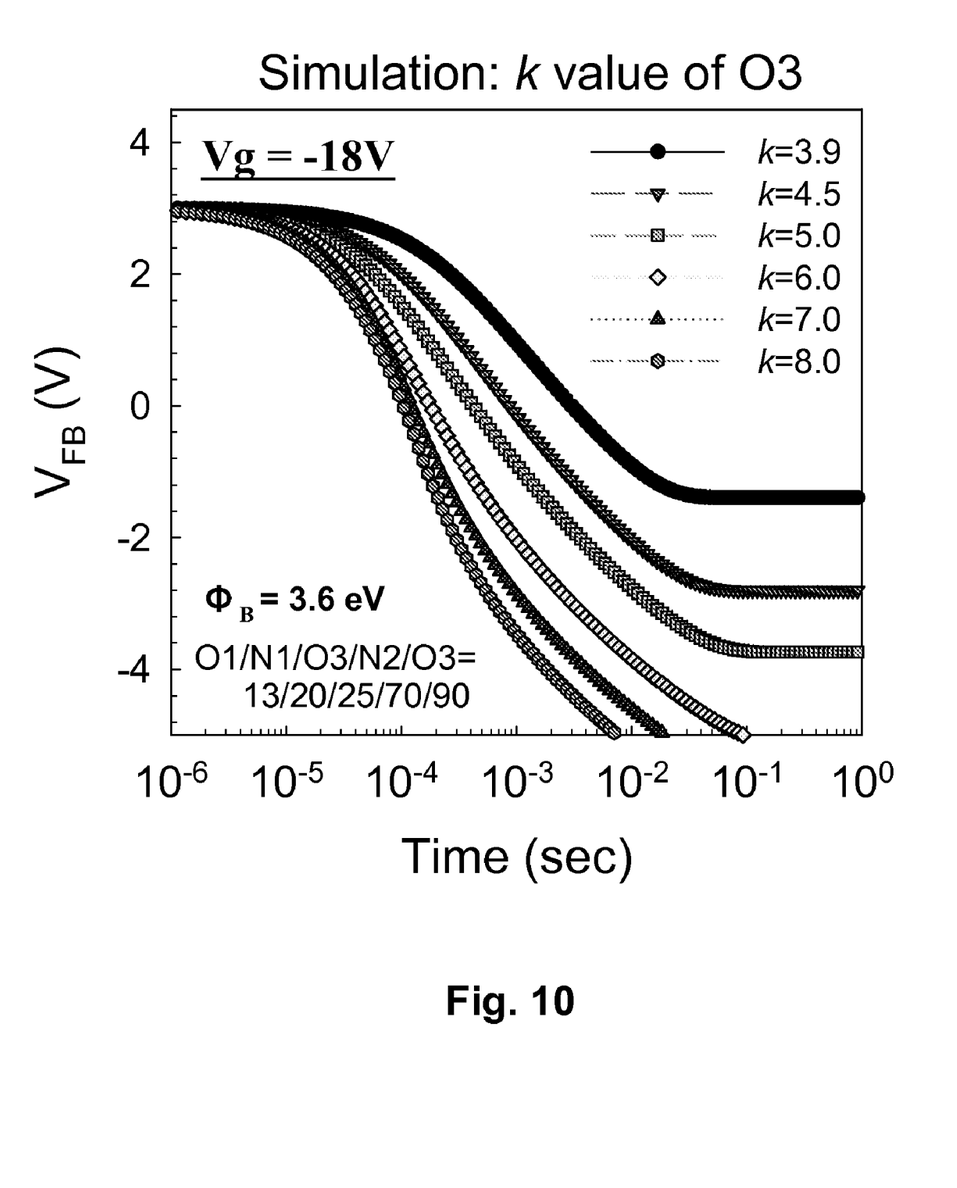
FIG. 10 is a graph of flat band voltage versus erase bias time showing erase curves for dielectric constants ranging from 3.9 to 8 for an embodiment of a memory cell according to the present invention.

FIG. 10 is a graph of flat band voltage (which correlates with threshold voltage for a memory cell) versus erase bias time showing simulated erase curves for various erase bias voltages for an embodiment of a memory cell having a tunneling dielectric layer comprising a tunneling layer (O1) of 13 Å of silicon dioxide on the channel surface, an offset layer (N1) of 20 Å silicon nitride and an isolation layer (O2) of 25 Å silicon dioxide, a charge trapping layer (N2) comprising 70 Å of silicon nitride, a blocking dielectric (O3) consisting of aluminum-doped silicon oxide 90 Å thick, tuned to the dielectric constants shown, and a P+ polysilicon gate. The channel is grounded in these examples, so that the gate voltage $V_G$ represents the bias voltage across the stack. The electron barrier height at the gate interface is about 3.6 eV for the purpose of the simulations. The plot shows the erase speed for $V_G$ of −18 V, with the dielectric constant ranging from 3.9 to 8, where 8 is the dielectric constant of pure aluminum oxide. Very high erase speeds are obtained using the structure, with erase saturation levels suppressed and good data retention.

Figure 11:
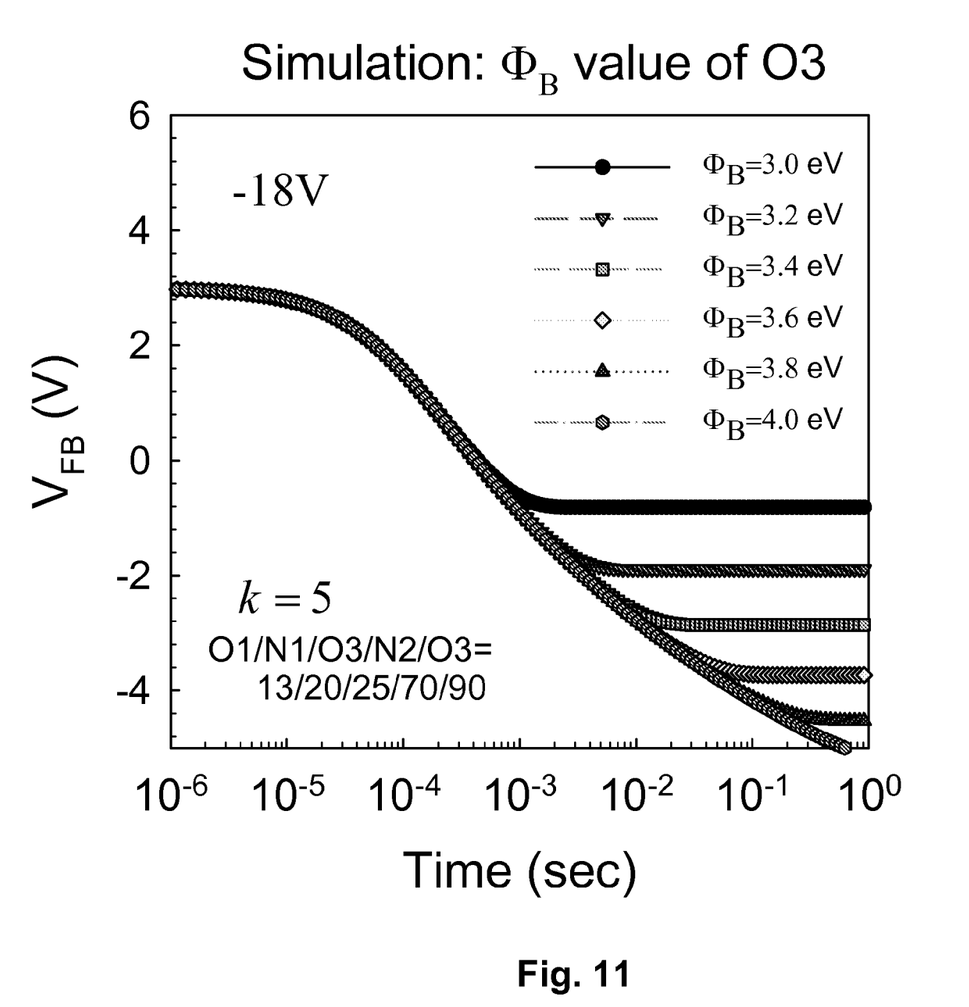
FIG. 11 is a graph of flat band voltage versus erase bias time showing erase curves for work functions at the gate/blocking dielectric interface ranging from 3 to 4 eV, for an embodiment of a memory cell according to the present invention.

FIG. 11 is a graph of simulated flat band voltage versus erase bias time for a cell like that described with respect to FIG. 10, assuming a dielectric constant of 5, but with various electron barrier heights ranging from 3 eV to 4 eV. Under the same bias voltage of negative 18 V, cells having a higher barrier height provide better suppression of erase saturation. The electron barrier height for P+ polysilicon and pure silicon dioxide is about 3.6 eV. The simulation shown in FIG. 10 teaches that erase saturation can be suppressed to $V_{FB} < -2V$ when the barrier height is >3.2 eV and the dielectric constant of medium-k top dielectric is >5. Therefore, there are two factors (barrier height and dielectric constant) shown herein that affect the erase saturation. It is noted here that barrier height is a function of conduction and valence band energy levels in the blocking dielectric and work function of the gate material. These parameters are matched with the electric field intensity required for erase through the tunneling dielectric stack, to establish an erase saturation level. As described herein, negative erase thresholds are readily achieved without reaching erase saturation levels.

The examples described above are implemented using n-channel devices, in which the source and drain terminals are doped with n-type impurities. The technology can be implemented using p-channel devices as well, in which the source and drain terminals are doped with p-type impurities.

The examples described above are implemented using devices with flat or planar channel surfaces. The technology can be implemented using non-planar structures, including cylindrical channel surfaces, fin shaped channels, recessed channels and so on.

The examples described above the charge storage stack is implemented so that the tunneling layer is on the channel surface and the blocking dielectric layer is adjacent the gate. In alternatives, the charge storage stack may be reversed, so that the tunneling layer is adjacent the gate terminal and the blocking dielectric is on the channel surface.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A charge trapping memory comprising an array of memory cells, respective memory cells in the array including:
   a semiconductor body including a channel having a channel surface, and source and drain terminals adjacent the channel; a dielectric stack between a gate and the channel surface;
   the dielectric stack comprising:
   a tunneling dielectric layer;
   a charge trapping dielectric layer on the tunneling dielectric layer;
   a blocking dielectric layer on the charge trapping dielectric layer, the blocking dielectric layer comprising a metal doped silicon oxide having a dielectric constant κ between 4.5 and 7.

2. The memory of claim 1, wherein the blocking dielectric layer is on the channel surface.

3. The memory of claim 1, wherein the tunneling dielectric layer is on the channel surface, and an electron barrier height between the gate and the blocking dielectric layer is more than 3 eV.

4. The memory of claim 1, wherein the tunneling dielectric layer comprises a combination of materials arranged to establish a relatively low valence band energy level near the channel surface, and an increase in valence band energy level at a first offset from the channel surface and a decrease in valence band energy at a second offset more than 2 nm from the channel surface.

5. The memory of claim 1, including:
circuitry, coupled to the array of memory cells, to apply bias voltages to selected memory cells for read, program and erase operations, including bias voltages across the gate and semiconductor body to induce an electric field having a magnitude of less than 14 MV/cm to cause hole tunneling through the tunneling dielectric layer.

6. The memory of claim 1, wherein the metal in the metal doped silicon oxide comprises aluminum having a concentration between 0.1 and 50 atomic percent relative to a sum of aluminum and silicon atoms.

7. The memory of claim 1, wherein the tunneling dielectric layer is on the channel surface, and the gate comprises a metal, metal compound, n+ doped polysilicon or p+ doped polysilicon.

8. The memory of claim 1, wherein the tunneling dielectric layer comprises a first silicon oxide layer adjacent the channel and having a thickness less than 20 Å, a low barrier height layer on the first silicon oxide layer, having a hole tunneling barrier height less than 3 eV, and an isolation layer isolating the low barrier height layer from the charge trapping dielectric layer.

9. The memory of claim 8, wherein the thickness of the first silicon oxide layer is 15 Å or less.

10. The memory of claim 1, wherein the tunneling dielectric layer comprises a first silicon oxide layer adjacent the channel and having a thickness of 20 Å or less, a silicon nitride layer on the first silicon oxide layer having a thickness of 30 Å or less, and a silicon oxide layer on the silicon nitride layer having a thickness of 30 Å or less.

11. The memory of claim 1, wherein the tunneling dielectric layer is on the channel surface, and the electron barrier height for the blocking layer is greater than 3 eV.

12. The memory of claim 1, wherein the tunneling dielectric layer is on the channel surface, and the electron barrier height for the blocking layer is greater than 3.2 eV and the dielectric constant is greater than 5.

13. A charge trapping memory comprising an array of memory cells, respective memory cells in the array including:
a semiconductor body including a channel having a channel surface, and source and drain terminals adjacent the channel;
a tunneling dielectric layer on the channel surface, including a first silicon oxide layer adjacent the channel and having a thickness of 20 Å or less, a silicon nitride layer on the first silicon oxide layer having a thickness of 30 Å or less, and a silicon oxide layer on the silicon nitride layer having a thickness of 30 Å or less;
a charge trapping layer on the tunneling dielectric layer comprising silicon nitride having a thickness of 50 Å or more;
a blocking dielectric layer on the charge trapping layer, the blocking dielectric layer comprising aluminum doped silicon oxide having between 0.1 and 50 atomic % aluminum relative to a sum of aluminum and silicon atoms; and
a gate on the blocking dielectric layer comprising polysilicon.

14. The memory of claim 13, wherein the dielectric constant of the blocking dielectric layer is greater than 5, and the gate comprises P+ polysilicon.

15. A method for manufacturing a charge trapping memory comprising:
forming a semiconductor body including a channel region on a semiconductor body, the channel region having a channel surface, and source and drain terminals adjacent the channel;
forming a gate overlying the channel region;
forming dielectric stack between the channel surface and the gate, including forming a tunneling dielectric layer; forming a charge trapping dielectric layer; and forming a blocking dielectric layer, the blocking dielectric layer comprising a metal doped silicon oxide having a dielectric constant κ between 4.5 and 7.

16. The method of claim 15, wherein an electron barrier height between the gate and the blocking dielectric layer is more than 3 eV.

17. The method of claim 15, wherein the tunneling dielectric layer comprises a combination of materials arranged to establish a relatively low valence band energy level near the channel surface, and an increase in valence band energy level at a first offset from the channel surface and a decrease in valence band energy at a second offset more than 2 nm from the channel surface.

18. The method of claim 15, wherein the metal in the metal doped silicon oxide comprises aluminum having a concentration between 0.1 and 50 atomic percent relative to a sum of aluminum and silicon atoms.

19. The method of claim 15, wherein the gate comprises a metal, a metal compound, n+ doped polysilicon or p+ doped polysilicon.

20. The method of claim 15, wherein the tunneling dielectric layer comprises a first silicon oxide layer adjacent the channel and having a thickness less than 20 Å, a low barrier height layer on the first silicon oxide layer, having a hole tunneling barrier height less than 3 eV, and an isolation layer isolating the low barrier height layer from the charge trapping dielectric layer.

21. The method of claim 20, wherein the thickness of the first silicon oxide layer is 15 Å or less.

22. The method of claim 15, wherein the tunneling dielectric layer comprises a first silicon oxide layer adjacent the channel and having a thickness of 20 Å or less, a silicon nitride layer on the first silicon oxide layer having a thickness of 30 Å or less, and a silicon oxide layer on the silicon nitride layer having a thickness of 30 Å or less.

23. The method of claim 15, wherein the electron barrier height for the blocking layer is greater than 3 eV.

24. The method of claim 15, wherein the electron barrier height for the blocking layer is greater than 3.2 eV and the dielectric constant is greater than 5.

* * * * *